United States Patent [19]

Masumi

[11] Patent Number: 5,219,831
[45] Date of Patent: Jun. 15, 1993

[54] SUPERCONDUCTIVE PHOTOCONDUCTIVE-SUBSTANCE OF THE LA-CU-O SYSTEM AND A METHOD FOR PRODUCING THE SAME

[75] Inventor: Taizo Masumi, Yokohama, Japan

[73] Assignee: University of Tokyo, Tokyo, Japan

[21] Appl. No.: 725,960

[22] Filed: Jul. 5, 1991

Related U.S. Application Data

[60] Continuation of Ser. No. 419,244, Oct. 10, 1989, abandoned, which is a division of Ser. No. 244,274, Sep. 14, 1988, abandoned.

[30] Foreign Application Priority Data

Feb. 4, 1988 [JP] Japan .................. 63-22692

[51] Int. Cl.$^5$ .............................................. H01B 12/00
[52] U.S. Cl. .......................................... 505/1; 505/777; 505/867
[58] Field of Search ........................ 505/1, 777, 867; 363/14

[56] References Cited

U.S. PATENT DOCUMENTS

| | | | |
|---|---|---|---|
| 4,886,776 | 12/1989 | Early et al. .............. | 505/1 |
| 4,973,574 | 11/1990 | Nishio et al. ............ | 505/1 |
| 4,990,487 | 2/1991 | Masumi .................... | 505/1 |

OTHER PUBLICATIONS

"Crystal Preparation of $(La_{1-x}M_x)_2CuO_{4-\delta}$ and Discovery of Magnetic Superconductors in Ba-Cu-O Systems" Moysoya et al. *Novel Superconductivity* Wolf/Kresen 1987-Plenum.

"A Novel Spectral Photoconductivity of the La-Cu-O Correlative with Superconductivity" Masumi et al. J. Phys. Soc. Japan (56) #9-Sep. 1987.

"Preparation of a High $T_c$ Superconductor by Oxidization of an Amorphous $La_{1.8}Sr_{0.2}Cu$ Alloy Ribbon in Air" Jap. J. of App. Phys. Apr. 1987.

*Primary Examiner*—Mark L. Bell
*Assistant Examiner*—A. Wright
*Attorney, Agent, or Firm*—Sughrue, Mion, Zinn, Macpeak & Seas

[57] ABSTRACT

The disclosed substance has a general chemical formula of $La_2\text{-}Cu_1\text{-}O_z$, z being 3.84 to 4.00. The disclosed substance shows, at a temperature below 20° K., superconductivity, either potential or real, and the substance also shows, at a temperature below 30° K., superconductive photoconductivity in response to incident exciting light in a wavelength range of 420 to 640 nm. The substance is produced by heating a mixture of starting material therefor at 900°–1,050° C. for 5–10 hours to cause solid state reaction, cooling gradually, shaping under pressure, re-sintering at 700°–1,200° C., and cooling either quickly at a rate of 2,000°–900° C./sec or slowly at a rate of 150°–200° C./hour.

9 Claims, 4 Drawing Sheets

FIG_1A
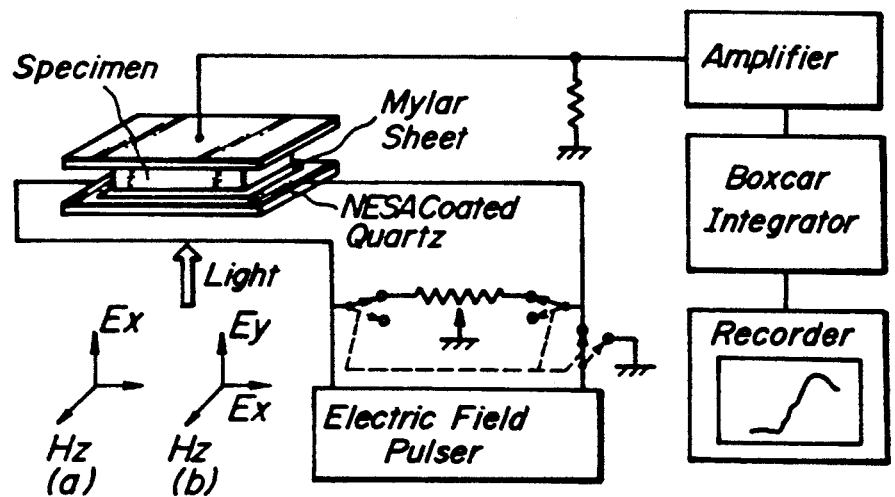
FIG_1B
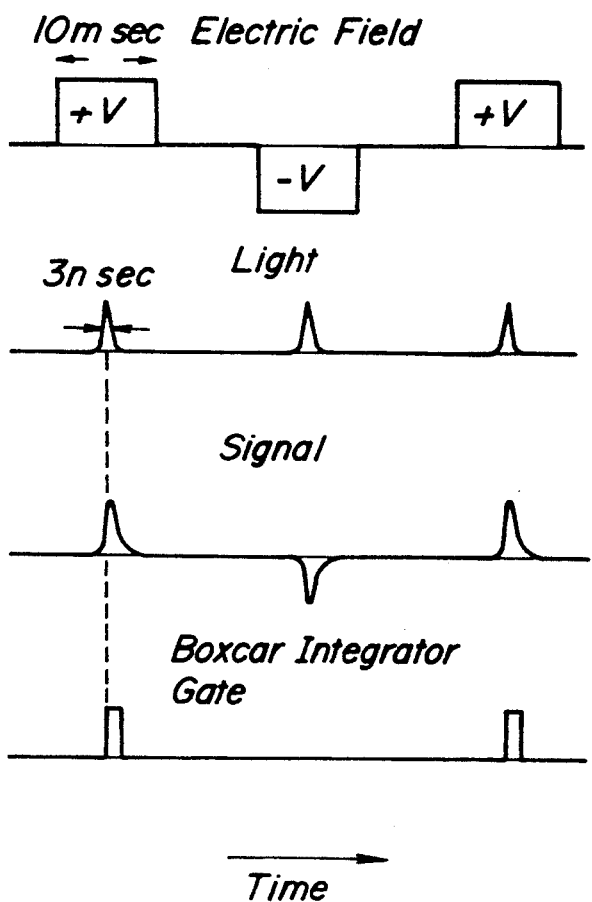

FIG._2A
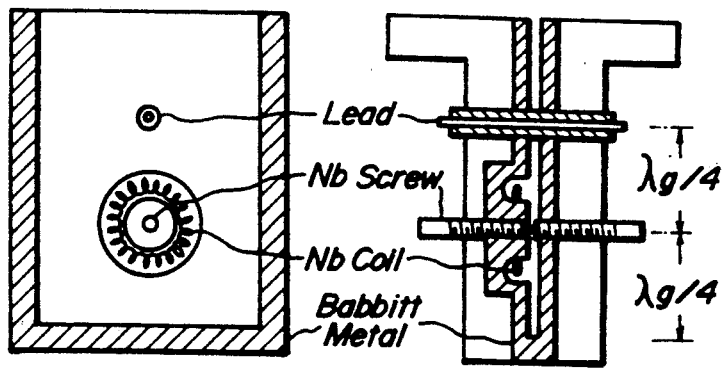
FIG._2B
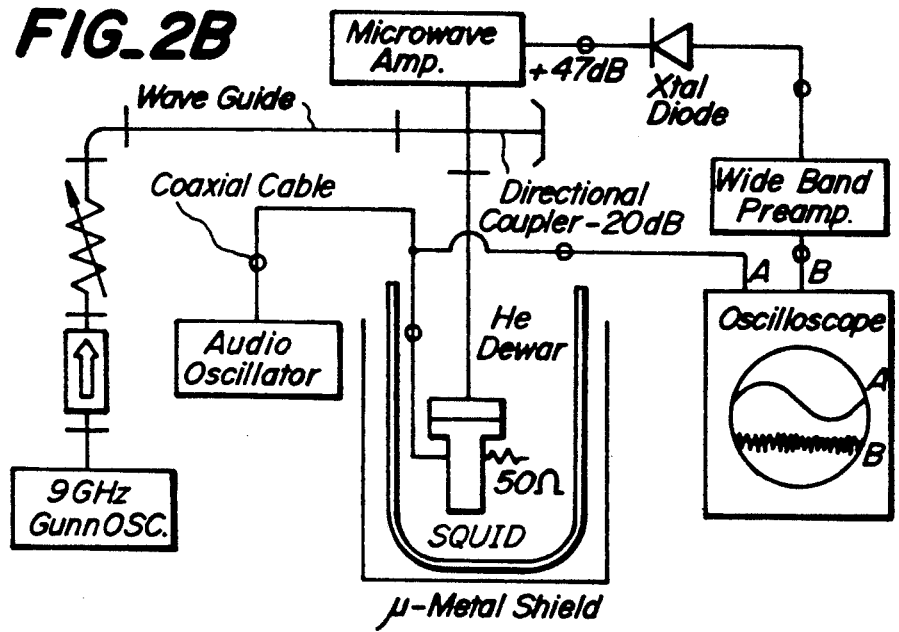
FIG._2C
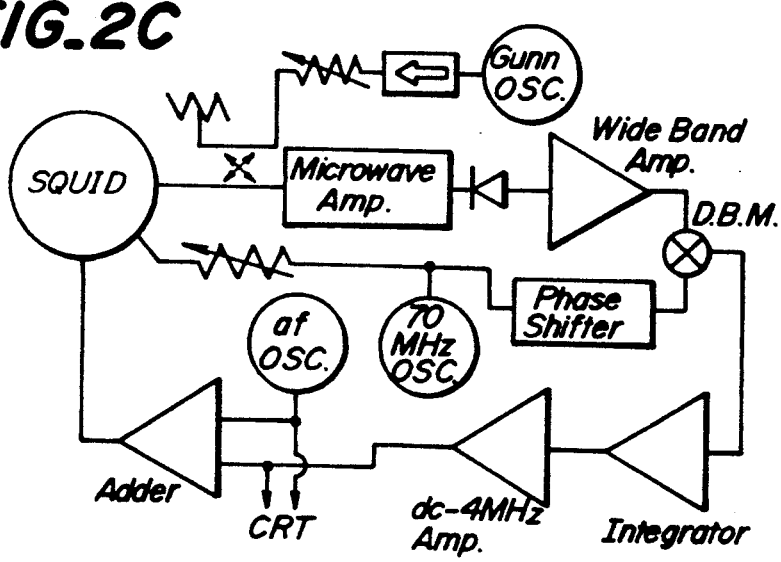

FIG_3A
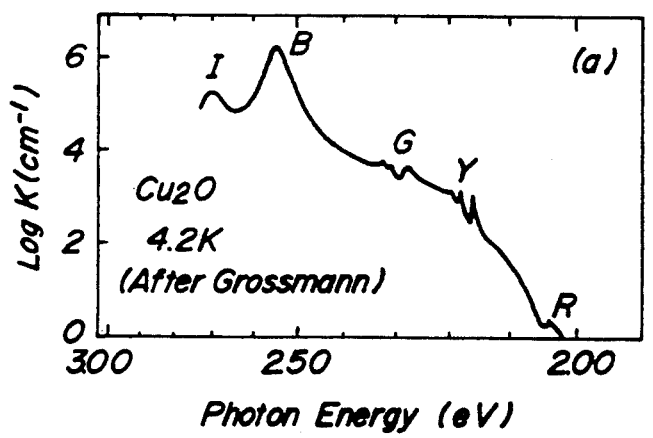
FIG_3B
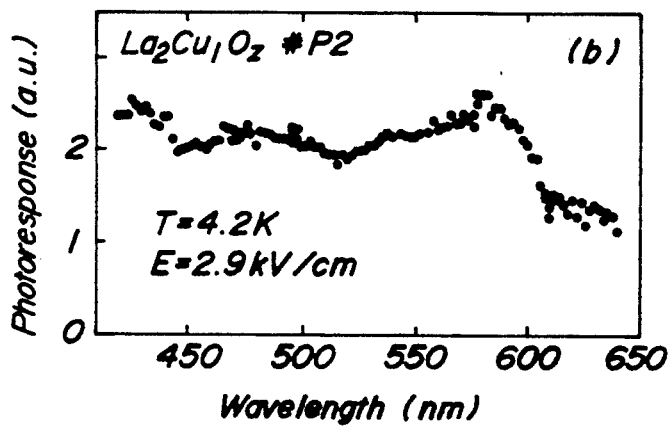
FIG_3C
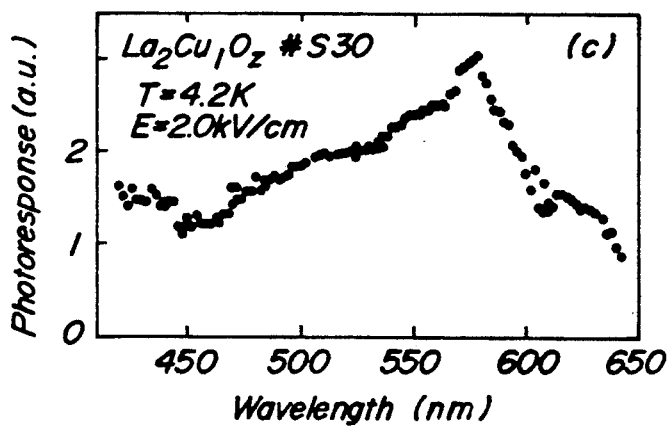

SUPERCONDUCTIVE PHOTOCONDUCTIVE-SUBSTANCE OF THE LA-CU-O SYSTEM AND A METHOD FOR PRODUCING THE SAME

This is a continuation of U.S. application Ser. No. 07/419,244 filed Oct. 10, 1989, now abandoned, which in turn is a divisional of U.S. application Ser. No. 07/244,274, filed Sep. 14, 1988 now abandoned.

BACKGROUND OF THE INVENTION

1. Field of the Invention

This invention relates to superconductive photoconductive-substance of the La-Cu-O system defined to be photoconductive, substance correlative with superconductivity whose composition is outside but includes even areas continuously close to that of regular oxide superconductors. Experiments on the optical properties, especially on the photoconduction in response to high-speed pulses, e.g. a pulsed light out of a dye laser, of substance with a chemical formula of $La_2Cu_1O_2$ have revealed an unexpected correlation between the superconductivity and the photoconductivity of the substance. The invention also relates to a method for producing the above-mentioned substance. When the substance is cooled very quickly, it becomes a photoconductive semiconductor. On the other hand, when the substance is cooled slowly, it becomes a photoconductive superconductor. The substance in the invention is expected to be useful in developing new industrial field of "Superconductive Opto-Electronics".

2. Related Art Statement

There has been no publications on such a system of substance which has superconductive photoconductivity or both superconductivity and inherent photoconductivity.

Conventional superconductors are metals or alloys in the main. Recently, much attention has been paid to high-temperature oxide superconductors, such as superconductors of the Y-Ba-Cu-O group, and considerable amounts of additives such as barium (Ba) and strontium (Sr) are used to raise the superconductive critical temperature ($T_c$). Studies and measurements on the optical properties of the superconductors at and in the proximity of visible wavelengths have been limited to the study of reflection and scattering of light therefrom due to a part of the metallic properties of such substance.

It has been believed that light is simply reflected from or scattered by the surface of a superconductor and is not allowed to enter therein. Study of optical properties, except the phenomena of reflection and scattering, has been treated as a completely different field from that of superconductivity in academic institutions, domestic and abroad, and in international conferences.

On the other hand, if any substance having superconductive photoconductivity or both superconductive capability and photoconductive capability is produced, a number of new electronic and optoelectronic devices may be developed; for instance, a superconductive phototransistor, a "superconductive optical computer" with a combined characteristics of the "superconductive computer" based on the currently studied Josephson devices and the "optical computer" proposed in optoelectronics, "superconductive optical fiber", and the like.

SUMMARY OF THE INVENTION

Therefore, an object of the present invention is to provide superconductive photoconductive-substance which reveals superconductive photoconductivity or both superconductivity and photoconductivity at a temperature below its critical temperature therefor.

The superconductive photoconductive-substance according to the invention has a general chemical formula of $La_2-Cu_1-O_z$, z being 3.84 to 4.00, which substance shows, at a temperature below 20° K., superconductivity and shows, at a temperature below 30° K., photoconductivity in response to incident light of wavelength 420 to 640 nm. The superconductivity may be potential or real.

Another object of the present invention is to provide a method for producing the above-mentioned superconductive photoconductive-substance which reveals superconductive photoconductivity or even both superconductivity and photoconductivity at a temperature below its critical temperature therefor.

With a method according to the invention for producing the superconductive photoconductive-substance with a general chemical formula of $La_2-Cu_1-O_z$, z being 3.84 to 4.00, a mixture of starting materials for a composition of said chemical formula is sintered by heating at 900°–1,050° C. for 5–10 hours, so as to cause solid phase reaction in the mixture. The sintered mixture is cooled gradually, and then shaped under pressure. The shaped mixture is sintered again at 700°–1,200° C., and finally cooled either quickly at a rate of 2,000°–900° C./sec or slowly at a rate of 150°–200° C./hour. Whereby, the substance thus produced shows superconductive photoconductivity or both superconductivity and photoconductivity.

The reason for limiting the composition of the substance of the invention to the above-mentioned general chemical formula is in the inventor's finding that the substance of such composition reveals superconductive photoconductivity or both photoconductivity and superconductivity, real or potential, as shown in the embodiments to be described hereinafter, provided that it is treated by the method of the invention; namely, the method comprising steps of heating at 900°–1,050° C. for 5–10 hours so as to cause solid phase reaction, cooling gradually for shaping, re-sintering at 700°–1,200° C., and cooling the sintered substance either quickly at a rate of 2,000°–900° C./sec or slowly at a rate of 150°–200° C./hour.

The inventors have found that even if the substance of the invention appears to be of insulating type, its photoconductivity depends both on temperature and wavelength of excitation light in such manner that a potential correlation with superconductivity of the substance is implied. The present invention is based on systematic studies on the above finding of the inventor.

BRIEF DESCRIPTION OF THE DRAWINGS

For a better understanding of the invention, reference is made to the accompanying drawings, in which:

FIG. 1A is a simplified block diagram showing principles of a photoconductivity [(a) dotted arrows] and the Hall effect [(b) solid arrows] measuring circuit which uses blocking electrodes and light pulses;

FIG. 1B illustrates time sequence charts showing waveforms of signals in the circuit of FIG. 1A;

FIG. 2A shows sectional views of an essential part of a static susceptibility measuring device using a microwave SQUID (Superconducting Quantum Interference Device);

FIG. 2B is a block diagram of the measuring system with the device of FIG. 2A;

FIG. 2C is a block diagram of the feedback system with the device of FIG. 2A;

FIG. 3A is a graph of light absorption by $Cu_2O$ as reported by Grosmann;

FIG. 3B is a graph showing the wavelength-dependence of photoconductive response $Q(\lambda,T)$ of the semiconducting specimen No., P2 $La_2$-$Cu_1$-$O_z$, z being about 3.88;

FIG. 3C is a graph showing the wavelength-dependence of photoconductive response $Q(\lambda,T)$ of the superconducting specimen No. S30 $La_2$-$Cu_1$-$O_z$, z being about 3.92.

DESCRIPTION OF THE PREFERRED EMBODIMENT

Figure 4:
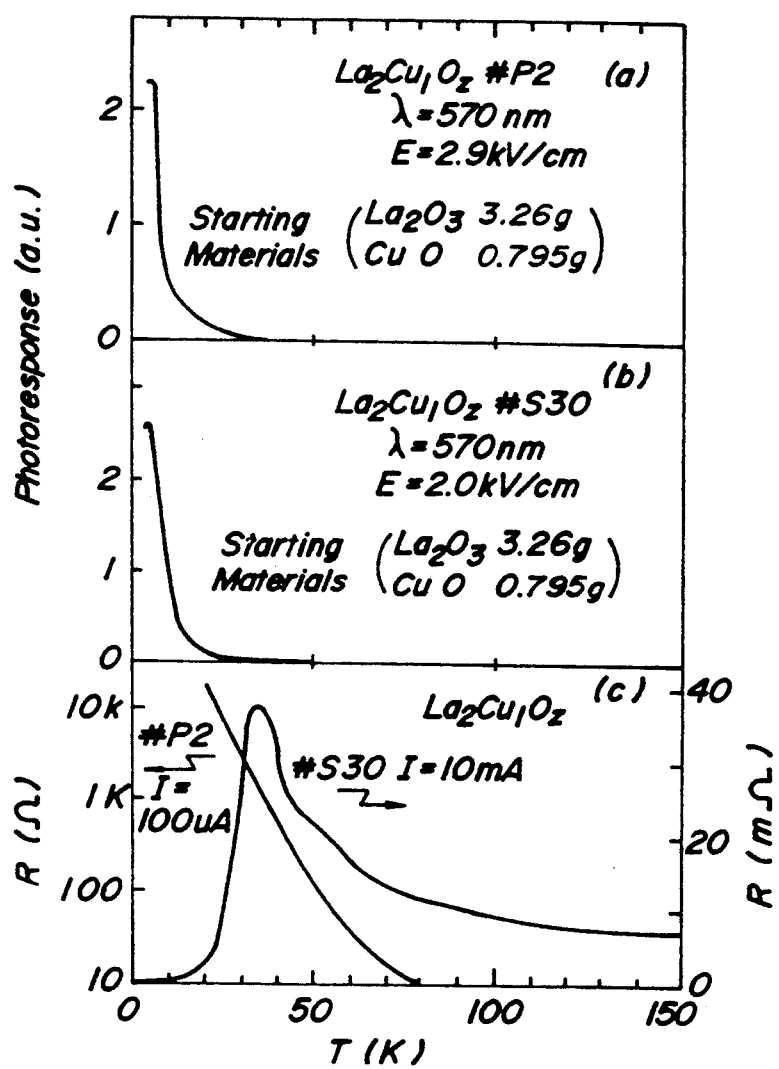
FIG. 4 illustrates the temperature-dependence of superconductive photoconductive-response $Q(\lambda,T)$ of both the semiconducting specimen No. P2 $La_2$-$Cu_1$-$O_z$ with z=3.88 and the superconducting specimen No. S30 $La_2$-$Cu_1$-$O_z$ with z=3.92 by the curves (a) and (b), respectively, and the temperature-dependence of dark resistance R(T) of the two specimens No. P2 and No. S30 by the curve (c).

Most of conventional oxide compounds such as La-Cu-O, Y-Cu-O or Y-Ba-Cu-O are normally insulators or semiconductors at the ground state, e.g., at low temperatures and in the dark. An elementary excitation can be created by giving the many-body ground state an appreciable amount of energy with relevant magnitude of momentum. Usually, for superconductors, these excitations beyond the energy gap destroy the superconductive ground state in the BCS theory. There is a possibility, however, to create a coherent state of elementary excitations above the ground state of insulating semiconductors such as bipolarons and excitons even in a thermally non-equilibrium state. We have found a new substance as an outcome of studies in fundamental physics and applied physics from the standpoint of the elementary excitation concept, in a sense parallel to, but rather orthogonal to the trend of studies of high-$T_c$ (critical temperature) superconductors. Namely, our finding relates to substance whose composition does not result in perfect super conductor, but the substance has a composition close to that of superconductor and reveals superconductive photoconductivity or both superconductivity and photoconductivity. The present invention has been completed based on that finding.

The invention will be described in further detail now by referring to embodiments.

EMBODIMENTS

The composition of the substance found by the inventors can be expressed by a chemical formula of $La_2$-$Cu_1$-$O_z$. The inventors have tried to seek into details of the complete scheme of a phase diagram of the substance, especially the variation of its properties for different values of z, i.e., the effects of oxygen deficiency. The studies of the inventors covered not only the superconducting phase but also its semiconducting phase and insulating phase.

A large number of specimens of $La_2$-$Cu_1$-$O_z$ system were made from the powders of $La_2O_3$ and CuO. The effect of the composition of the starting materials was carefully studied, and it was found that the oxygen content in terms of the value of z was more or less controllable depending on the speed of cooling.

The specimen No. P2 was made by mixing 3.26 g of $La_2O_3$ and 0.795 g of CuO, and sintering the mixture so as to produce $La_2$-$Cu_1$-$O_z$. The specimen No. S30 was made by mixing 3.26 g of $La_2O_3$ and 0.795 g of CuO, and sintering the mixture so as to produce $La_2$-$Cu_1$-$O_z$. Here, z represents the amount of oxygen in the substance, and it varies depending on the sintering conditions so as to produce a variety of physical properties of the final products.

To make the specimens, for instance, the starting materials of the above composition were measured and thoroughly mixed and crushed, and primary sintering of the starting material mixture was effected at 900°–1,050° C. for 4 hours so as to cause solid phase reaction in the mixture. After being cooled gradually, in general, the sintered mixture was shaped, for instance, into pellets under pressure, and secondary sintering was effected at 1,050° C. for 4 to 6 hours. The specimens No. P2 were very quickly cooled to the temperature of liquid nitrogen (77° K.). The other specimens No. S30 were annealed at 900° C. for 3 hours and at 700° C. for 2 hours and then cooled slowly to room temperature in 4 hours. (In general, said primary sintering can be skipped and the secondary sintering may only be applied therefor at the elevated temperature.)

EXPERIMENTAL METHODS

Despite our study efforts to seek into details, the complete scheme of a phase diagram of $La_2$-$Cu_1$-$O_z$ is still under investigation. Particularly important is the control of oxygen deficiency. Irrespective of enormous efforts of scientists, perhaps it will take a while to complete it. Here, we have been interested not only in the superconductive phase but also in semiconducting phases. A large number of specimens of the La-Cu-O system were made from the powders of $La_2O_3$ and CuO by using the method already described in numerous references. Composition of starting materials and the annealing or quenching process have been studied in detail and have become more or less controllable.

Since specimens of the $La_2$-$Cu_1$-$O_z$ system within a certain part of the values of z become highly insulating or at least semiconducting at low temperatures, two types of techniques were adopted for resistivity or/and conductivity measurements in our experiments. First, for insulating specimens ($\rho \gtrsim 10^8$ $\Omega \cdot cm$ at 4.2° K.) such as No. P2, a fast pulse technique with blocking electrodes as shown in FIG. 1A was adopted to overcome the difficulties previously noted, especially such as those associated with the non-ohmic contact electrodes, the build-up of space charge and with the low signal-to-noise ratio due to low carrier density in high-impedance materials.

In this technique we used, for instance, pulse electric fields up to E≃3 kV/cm with a duration of 10 ms and a repetition rate of 13 Hz were used with a synchronized pulse excitation of light of 3 ns, as shown in FIG. 1B. Second, for moderately conducting specimens ($\rho \lesssim (10^{-2}$–$10^{-1})$ $\Omega \cdot cm$) such as specimen No. S30, resistivity measurements were performed by adopting the usual four-probe method in the dark without using any exciting light.

Static magnetic susceptibility or magnetization M(T,H) was measured in weak fields up to H≃500 Oe by using a microwave SQUID (Superconducting Quantum Interference Device) at 9 GHz as shown in FIG.

2A and FIG. 2B. The system was normally operated in the mode locked to the Q-pattern as shown in FIG. 2C.

In the measurement of photoconductivity, specimens were optically excited by a pulsed dye laser. Spectral responses were also carefully studied. Photocarrier density was of the order of ($10^6$ to $10^8$)/cm$^3$ averaged over a specimen. All photosignals were normally detected in the synchronized mode by using the Boxcar integrator.

EXPERIMENTAL RESULTS

A specimen of $La_2$-$Cu_1$-$O_z$ such as No. S30 looks black and usually has resistivity of the order of $\rho \leq 10^{-1}$ $\Omega$·cm. However, we have observed definite signals of photoconductivity in both of the specimens of $La_2$-$Cu_1$-$O_z$ No. S30 and No. P2 at temperature below 30° K. by applying the transient pulse technique described above.

Firstly, the dependence of photoconductivity $Q(\lambda,T,E,H)$ on E was found to be almost linear up to $E \approx 3$ kV/cm at about 4.2° K. No appreciable magnitude of the transverse and longitudinal magneto-resistance in $Q(\lambda,T,E,H)$ has been observed up to $H \approx 15$ kOe at 4.2° K. FIG. 3B and FIG. 3C illustrate typical spectra of pulse-excited transient photoresponse $Q(\lambda,T)$ over wavelengths 420 to 640 nm of $La_2$-$Cu_1$-$O_z$ specimens No. P2 and No. S30, respectively. FIG. 3A shows the well established reference data of the optical absorption of $Cu_2O$ reported by Grosmann. The symbols R, Y, G, B and I on the curve of FIG. 3A represent red, yellow, green, blue and indigo regions, respectively.

Secondly, the values of the magnetizations M(T,H) of the superconducting $La_2$-$Cu_1$-$O_z$ specimen No. S30 has been observed to be very small $|\chi| < 3 \times 10^{-8}$ at most at 4.2° K. Similar phenomena have been reported for the La-Cu-O system by Kang et al. They also observed the critical current and critical magnetic field of superconductivity even for such specimens, so as to prove their superconductive properties.

Thirdly, temperature dependence of the pulse-excited transient photoresponse $Q(\lambda,T)$ in the region between $\lambda \approx 420$–640 nm were studied both for the semiconducting specimen No. P2 and for the superconducting specimen No. S30 as illustrated in the curves (a) and (b) of FIG. 4, respectively. Surprisingly, there definitely exists a remarkable similarity between general features of the transient photoresponse $Q(\lambda,T)$ for No. P2 and No. S30, regardless or the huge difference in dark resistivity $\rho(T)$ as illustrated in the curve (c) of FIG. 4. One must clearly recognize an onset of "photoconductivity" $Q(\lambda,T)$ around 30°–40° K. and after a monotonous increase the slight decrease of $Q(\lambda,T)$ below 5° K. for both semiconducting and superconducting specimens No. P2 and No. S30.

Finally, the resistivity $\rho(T)$ in the dark of the superconducting $La_2$-$Cu_1$-$O_z$ specimen No. S30 and semiconducting $La_2$-$Cu_1$-$O_z$ specimen No. P2 is displayed in the curve (c) of FIG. 4 as a function of temperature. One immediately notices that the specimen No. S30 becomes superconducting below $T \approx 10°$–35° K., whereas the specimen No. P2 becomes insulating.

It is by no means easy to interpret these facts in a simple manner. Heating effects of specimens by light excitations have been carefully examined and estimated to be sufficiently small. At 300° K., both $La_2$-$Cu_1$-$O_z$ specimens No. P2 and No. S30 are semiconductive. In the superconducting specimen No. S30, the "photoconductivity" observed with the blocking electrodes is compatible with "superconductivity" probably due to the insulating part of this specimen as illustrated in the curves (b) and (c) of FIG. 4. Surprisingly, there exists an "occurrence of photoconductivity" potentially correlative with superconductivity underlying even in semiconducting specimen No. P2 as displayed in the curve (a) of FIG. 4.

DISCUSSION

It is a widely recognized fact that the specimens $La_2$-$Cu_1$-$O_z$ usually have dark red or black colors. The spectral response of photoconductivity $Q(\lambda,T)$ in FIGS. 3B and 3C strongly suggests that there exists a region of the $Cu_2O$-like state in the specimen of $La_2$-$Cu_1$-$O_z$, if not atomic layer.

Optical absorption and photoconductivity of $Cu_2O$ have been thoroughly analyzed in terms of the exciton theory as a typical example of Mott-Wannier exciton. The positions of the fine structures in the $Q(\lambda,T)$ coincide with those of the fundamental absorption edge in $Cu_2O$. We can recognize a few prominent fine structure probably due to the excitons, e.g., in the yellow series $n=2$ around $\lambda \approx 580$ nm in the photoconductivity spectra of $La_2$-$Cu_1$-$O_z$ similar to those of $Cu_2O$. Thus, we may reasonably conceive that there exists at least a finite fraction of the $Cu_2O$-like phase which cannot be ignored in the La-Cu-O systems, where the photoexcited electrons and holes are definitely mobile, irrespective of a certain difference of the crystal structures.

A conduction electron or a positive hole in standard types of $Cu_2O$ crystals has been reported to form a rather "large polaron" with $\alpha \approx 0.14$–0.18, $\alpha$ being a coupling constant with the LO-phonon. The sign of the photoresponse in the Dember effect indicates that, among the carriers generated by the photoexcitation whose life is long and whose contribution is significant, the dominant carriers are conduction electrons in the case of $La_z$-$Cu_1$-$O_z$. In both cases of La-Cu-O system and Y-Cu-O and Y-Cu-Ba-O system, however, an onset of "photoconductivity" $Q(\lambda,T)$ even in the insulating specimens is clearly associated with an onset of "superconductivity" $\rho(T)$ as if the superconductivity potentially underlies at the back of the photoconductive phenomena. Thus, the dynamical effects of a polaron, whether it is a "large polaron" with the LO-phonons, a "small polaron" due to the Jahn-Teller effect or possibly an intermediate one due to both effects, they must be at least substantially important as indicated in FIGS. 3A through 3C and in curves (a) through (c) of FIG. 4, as well as the "electronic polaron effect". They are probably effective in a coherently hybridized form of these elementary excitation. Here, we pay special attention to the electronic polarons, which one may call "an excitonic polaron". No one can fail to recognize close association among polarons and excitons with the experimental data here.

These polarons and excitons had yielded out of the optical interband transition from the hybridized 2p-Oxygen and 3d-Cu valence bands leaving $(3d)^9$ positive holes to the 4s-Cu conduction band creating a $(4s)^1$ conduction electron together with the LO-phonon interaction. A polaron can be created either by the optical excitation here or substitution of La by Ba or Sr, especially in the La-Cu-O system. Since the positive holes in the hybrid 2p(O) and 3d(Cu) bands can be created from the many-body ground state by either an intra- or interband transition, the electron correlation effect is naturally important. One must pay more attention to the dynamical valence fluctuation between $Cu^{1+}$ and $Cu^{2+}$ as well as between $Cu^{2+}$ and $Cu^{3+}$. Therefore, for the mechanism of high-$T_c$ superconductivity, we may reasonably conceive potential roles of an ensemble of polarons, whether large or small, and especially closely associated excitons. The ensemble of united polarons and excitons here are probably a set of bipolarons, polaronic excitons and/or, most probably, "exciton-mediated bipolarons" due to the dynamical electron-phonon and electron correlation effect. As indicated in the curve (a) of FIG. 4, photosignals $Q(\lambda,T)$ in the La-Cu-O reflect the occurrence of superconductivity in the La-Ba-Cu-O and La-Sr-Cu-O. Consequently, the inventors believe that these studies of elementary excitations here must reveal the nature of the superconducting ground state, irrespective of an enormous difference in carrier density. To the best knowledge of the inventors, this is the first clear experimental indication of the polaron and exciton mechanisms displayed in the high-$T_c$ superconductivity with little diamagnetism.

Here, the inventor reports the first observation of expected accordance of the onsets, i.e., the correlation of "spectral photoconductivity" with "superconductivity (zero resistance)" and little diamagnetism (due to certain reasons) at least in superconducting La-Cu-O system and possibly in semiconducting La-Cu-O system at 4.2° K. to 100° K. Thus, we reconfirm the dynamical mechanism due to polarons and excitons, i.e., "the exciton-mediated bipolarons mechanism" in the high-$T_c$ superconductivity.

EFFECT OF THE INVENTION

As described in detail in the foregoing, the inventor has succeeded in providing "superconductive photoconductive-substance" of $La_2-Cu_1-O_z$ (z being 3.84 to 4.00) system and a "method for producing the substance", which substance has little diamagnetism (due to certain reasons) but has such "photoconductivity" that is correlated with "superconductivity (zero resistance)". The invention has been completed by experiments over a wide range of very low temperatures, i.e., 4.2° K. to 100° K., while measuring electric conductivity by using both the d.c. four-probe method and the repetitive optical pulse method and measuring static magnetic susceptibility by using a microwave SQUID.

It should be noted that the invention is an outcome of theoretical and experimental studies on the "dynamical mechanism of polarons and excitons" or "exciton-mediated bipolarons" for "high-temperature superconductivity" as proposed by the inventor. The proposed substance of the invention will open a new scientific and industrial field, to be named as "Superconductive Opto-Electronics", wherein superconductivity is directly controlled by light.

Although the invention has been described with a certain degree of particularity, it must be understood that the present disclosure has been made only by way of the example and that further numerous changes in details, e.g. an extension to $La_{2-x}Ba_xCu_yO_z$ and $La_{2-x}Sr_xCu_yO_z$, may be resorted to without departing from the scope of the invention as hereinafter claimed.

What is claimed is:

1. A method for eliciting the photoconductivity $Q(\lambda,T)$ of a photoconductive substance of the La-Cu-O system having a general chemical formula of $La_2-Cu_1-O_z$, z being 3.84 to 4.00, comprising the steps of maintaining said photoconductive substance at a temperature (T) below 30° K. and exposing said photoconductive substance to photoexciting irradiation of wavelength ($\lambda$) in the range of 420 to 640 nm.

2. The method as in claim 1, wherein said exposing step is carried out by exposing the photoconductive substance to light from a dye laser.

3. The method as in claim 1, wherein said exposing step generates a photocarrier density in the photoconductive substance of from ($10^6$ to $10^8$ )/$cm^3$ averaged over the photoconductive substance.

4. The method as in claim 2, wherein said light from a dye laser is pulsed light.

5. The method as in claim 4, wherein said pulsed light is of 3 ns width and pulsed at a rate of 13 Hz.

6. The method as in claim 1, wherein said photoconductive substance is exposed to photoexciting irradiation having an intensity of at least $2 \times 10^3$ W/$cm^2$ nm.

7. The method as in claim 1, wherein the photoconductive substance comprises a semiconductive portion in the dark at a temperature (T) below 30° K.

8. The method as in claim 1, wherein the photoconductive substance is a semiconductor in the dark at a temperature (T) below 30° K.

9. The method as in claim 1, wherein z is from 3.84 to 3.88.

* * * * *